US010587280B2

(12) United States Patent
Chen et al.

(10) Patent No.: US 10,587,280 B2
(45) Date of Patent: Mar. 10, 2020

(54) DIGITAL TO ANALOG CONVERTER DEVICE

(71) Applicant: Realtek Semiconductor Corporation, Hsinchu (TW)

(72) Inventors: Chih-Lung Chen, Zhubei (TW); Shih-Hsiung Huang, Miaoli County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/211,415

(22) Filed: Dec. 6, 2018

(65) Prior Publication Data

US 2019/0207616 A1 Jul. 4, 2019

(30) Foreign Application Priority Data

Dec. 29, 2017 (TW) .............................. 106146610 A
Aug. 21, 2018 (TW) .............................. 107129155 A

(51) Int. Cl.
*H03M 1/10* (2006.01)
*H03M 1/06* (2006.01)
*H03M 1/68* (2006.01)

(52) U.S. Cl.
CPC ....... *H03M 1/1014* (2013.01); *H03M 1/0665* (2013.01); *H03M 1/68* (2013.01)

(58) Field of Classification Search
CPC .... H03M 1/0673; H03M 1/0641; H03M 1/12; H03M 1/468; H03M 1/747; H03M 1/66;
(Continued)

(56) References Cited

U.S. PATENT DOCUMENTS 4,544,911 A * 10/1985 Altman .................. H03M 1/08
341/118
4,994,803 A * 2/1991 Blackham ........... H03M 1/0641
341/131

(Continued)

FOREIGN PATENT DOCUMENTS

| EP | 2809007 B1 | 3/2017 |
| WO | 2011022243 A1 | 2/2011 |
| WO | 2011119315 A1 | 9/2011 |

OTHER PUBLICATIONS

Chi-Yun Wang et al., "A Mode-Configurable Analog Baseband for Wi-Fi 11ac Direct-Conversion Receiver Utilizing a Single Filtering ΔS ADC", IEEE Radio Frequency Integrated Circuits Symposium, 2016, pp. 170-173.

(Continued)

*Primary Examiner* — Linh V Nguyen
(74) *Attorney, Agent, or Firm* — Locke Lord LLP; Tim Tingkang Xia, Esq.

(57) ABSTRACT

A digital-to-analog converter (DAC) device includes a DAC circuitry, a calibration circuitry, and a randomization circuitry. The DAC circuitry includes a first DAC circuit and a second DAC circuit. The first DAC circuit is configured to generate a first signal according to least significant bits of an input signal. The second DAC circuit is configured to output a second signal. The calibration circuitry is configured to compare the first signal with the second signal, in order to calibrate the second DAC circuit. The randomization circuitry is configured to randomize most significant bits of the input signal, in order to generate first control signals, in which the second DAC circuit is further configured to generate the second signal according to the most significant bits or the first control signals.

20 Claims, 5 Drawing Sheets

(58) Field of Classification Search
CPC ...... H03M 1/687; H03M 1/1057; H03M 3/30; H03M 3/332; H03M 3/452; H03M 1/0639; H03M 1/1047
USPC .................................. 341/118, 120, 144, 145
See application file for complete search history.

(56) References Cited

U.S. PATENT DOCUMENTS

| | | | | |
|---|---|---|---|---|
| 5,684,487 | A | * | 11/1997 | Timko ................ H03M 1/1047 341/120 |
| 5,977,899 | A | * | 11/1999 | Adams .................... H03M 3/50 341/143 |
| 5,982,317 | A | * | 11/1999 | Steensgaard-Madsen ................... H03M 1/067 341/143 |
| 6,154,162 | A | * | 11/2000 | Watson ............... H03M 1/0673 341/144 |
| 6,522,277 | B2 | | 2/2003 | Fujimori et al. |
| 9,007,249 | B2 | | 4/2015 | Ho et al. |
| 9,024,795 | B2 | | 5/2015 | Muthers |
| 9,035,814 | B2 | | 5/2015 | Chang |
| 10,069,505 | B1 | * | 9/2018 | Poulton ............... H03M 1/0641 |
| 2003/0189504 | A1 | | 10/2003 | Colonna et al. |
| 2011/0018753 | A1 | * | 1/2011 | Lou ..................... H03M 7/3022 341/144 |
| 2012/0112938 | A1 | * | 5/2012 | Haneda ................... H03M 1/12 341/110 |
| 2014/0240154 | A1 | * | 8/2014 | Kim ........................ H03M 3/32 341/143 |
| 2016/0134302 | A1 | * | 5/2016 | Schafferer ............ H03F 1/3241 341/120 |

OTHER PUBLICATIONS

Yonghua Cong et al., "A 1.5-V 14-Bit 100-MS/s Self-Calibrated DAC", IEEE Journal of Solid-State Circuits, vol. 38, No. 12, 2003, pp. 2051-2060.

John G. Kauffman et al., "An 8.5 mW Continuous-Time ΔS Modulator With 25 MHz Bandwidth Using Digital Background DAC Linearization to Achieve 63.5 dB SNDR and 81 dB SFDR", IEEE Journal of Solid-State Circuits, 2011, vol. 46, No. 12, pp. 2869-2881.

Yusuke Ikeda et al., "A 14-bit 100-MS/s Digitally Calibrated Binary-Weighted Current-Steering CMOS DAC without Calibration ADC", Solid-State Circuits Conference, 2007. IEEE.

Jen-Hung Chi et al., "A 1.8-V 12-Bit 250-MS/s 25-mW Self-calibrated DAC", IEEE, 2010.

* cited by examiner

US 10,587,280 B2

DIGITAL TO ANALOG CONVERTER DEVICE

RELATED APPLICATIONS

This application claims priority to Taiwan Application Serial Number 106146610, filed Dec. 29, 2017, and also claims priority to Taiwan Application Serial Number 107129155, filed Aug. 21, 2018, both of which are hereby incorporated by reference in their entirety.

BACKGROUND

Technical Field

The present disclosure relates to a digital to analog converter (DAC) device. More particularly, the present disclosure relates to the DAC device having a calibration mechanism and a randomization mechanism.

Description of Related Art

Digital to analog converter (DAC) has been widely applied to various electronic devices. Due to limitations like process variations, non-ideal characteristics, etc., linearity of the DAC is not able to be increased. As a result, the practical DAC is difficult to meet the current speed and resolution requirements.

SUMMARY

Some aspects of the present disclosure are related to a digital-to-analog converter (DAC) device, which includes a DAC circuitry, a calibration circuitry, and a randomization circuitry. The DAC circuitry includes a first DAC circuit and a second DAC circuit. The first DAC circuit is configured to generate a first signal according to a plurality of least significant bits of an input signal. The second DAC circuit is configured to output a second signal. The calibration circuitry is configured to compare the first signal with the second signal, in order to calibrate the second DAC circuit. The randomization circuitry is configured to randomize a plurality of most significant bits of the input signal, in order to generate a plurality of first control signals, in which the second DAC circuit is further configured to generate the second signal according to the plurality of most significant bits or the plurality of first control signals.

As described above, the DAC devices provided in embodiments of the present disclosure employ both of calibration and randomization mechanisms to improve the linearity, at low and high frequency bands, of the DAC device, in which the randomization mechanism may be arranged to randomize partial bits to reduce circuit area for meeting the high speed requirement.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present embodiments. Furthermore, for simplifying the drawings, some of the conventional structures and elements are shown with schematic illustrations.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other.

In this document, the term "circuitry" may indicate a system formed with one or more circuits. The term "circuit" may indicate an object, which is formed with one or more transistors and/or one or more active/passive elements based on a specific arrangement, for processing signals.

For ease of understanding, like elements in figures are designated with the same reference numbers.

Figure 1:
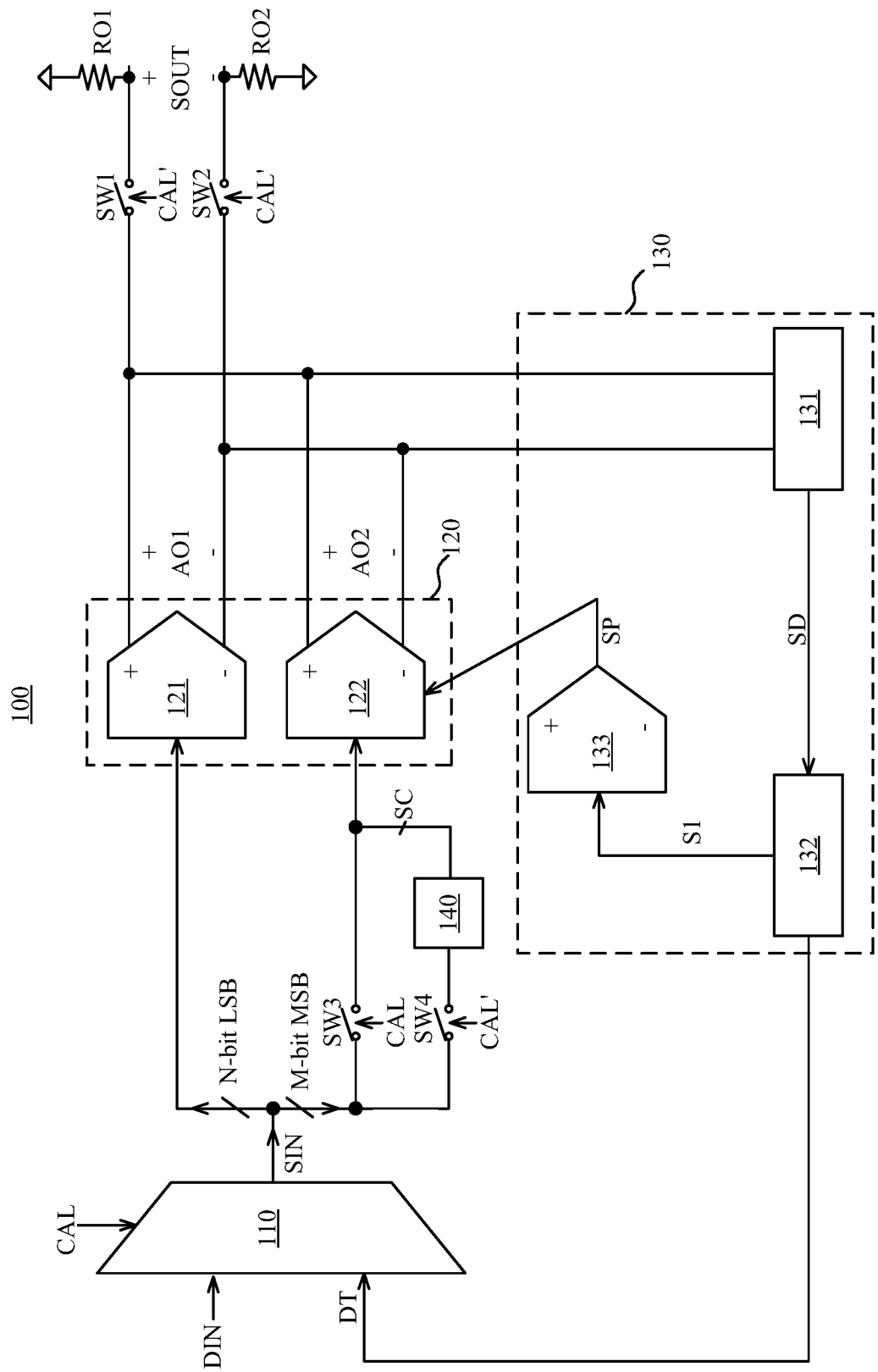
FIG. 1 is a schematic diagram of a digital-to-analog converter (DAC) device, according to some embodiments of the present disclosure.

Reference is now made to FIG. 1. FIG. 1 is a schematic diagram of a digital-to-analog converter (DAC) device 100, according to some embodiments of the present disclosure.

The DAC device 100 includes a multiplexer circuitry 110, a DAC circuitry 120, a calibration circuitry 130, and a randomization circuitry 140. The multiplexer circuitry 110 receives a data signal DIN, a testing signal DT, and a mode control signal CAL and selectively outputs one of the data signal DIN or the testing signal DT as an input signal SIN according to a mode control signal CAL. For example, when operating in a normal mode, the mode control signal CAL has a first logic value. In response to this first logic value, the multiplexer circuitry 110 outputs the data signal DIN as the input signal SIN: Alternatively, when operating in a calibration mode, the mode control signal CAL has a second logic value. In response to the second logic value, the multiplexer circuitry 110 outputs the testing signal DT as the input signal SIN.

The DAC circuitry 120 is coupled to the multiplexer circuitry 110 to receive the input signal SIN. The DAC circuitry 120 includes a DAC circuit 121 and a DAC circuit 122. The DAC circuit 121 is configured to generate a signal AO1 according to N least significant bits (LSB) of the input signal SIN. The DAC circuit 122 is configured to generate a signal AO2 according to M most significant bits (MSB) of the input signal SIN.

In some embodiments, the DAC circuitry 120 may be implemented with a current-steering DAC circuit. The current-steering DAC may be implemented with unity current source circuits having different current ratios, in which these unity current source circuits may be turned on according to the input signal SIN, in order to output a corresponding current signal as the signal AO1 or AO2. In these embodiments, the DAC device 100 further includes resistors RO1-RO2. The resistors RO1-RO2 are coupled to output terminals of the DAC circuits 121 and 122, respectively, in order to convert a summation of the signals AO1 and AO2 into an analog output SOUT as a voltage signal.

The above descriptions are given with the current-steering DAC for illustrative purposes, and various types of DACs are able to be employed to implement the DAC circuitry 120. Moreover, the encoding discussed in subsequent paragraphs is for illustrative purposes, and the present disclosure is not limited thereto.

In some embodiments, the calibration circuitry 130 is coupled to the DAC circuitry 120, and is configured to calibrate the DAC circuit 122 based on the signals AO1 and AO2 in the calibration mode. In some embodiments, the calibration circuitry 130 includes a detector circuit 131, a digital controller circuit 132, and a DAC circuit 133.

The detector circuit 131 is coupled to output terminals of the DAC circuits 121-122, in order to receive the signals AO1 and AO2. In some embodiments, the detector circuit 131 is configured to compare the signal AO1 with the signal AO2, in order to generate a detection signal SD. In some embodiments, the detector circuit 131 may be implemented with a current comparator, but the present disclosure is not limited thereto.

The digital controller circuit 132 is coupled to the multiplexer circuitry 110 and the detector circuit 131. In some embodiments, the digital controller circuit 132 is arranged with a memory (not shown), which is configured to store a predetermined testing signal DT, in order to provide the testing signal DT to the multiplexer circuitry 110 in the calibration mode. In some embodiments, the digital controller circuit 132 further performs a calibration algorithm in response to the detection signal SD, in order to generate a calibration signal S1. Operations regarding the calibration algorithm are described in subsequent paragraphs.

The DAC circuit 133 is coupled to the DAC circuit 122 and the digital controller circuit 132. In some embodiments, the DAC circuit 133 is configured to output a compensation signal SP according to the calibration signal S1, in order to calibrate the DAC circuit 122. For example, in FIG. 1, if the DAC circuit 122 is a current-steering DAC implemented with multiple unity current sources, the compensation signal SP may be directly inputted into the DAC circuit 122, in order to calibrate a bias voltage of a corresponding unity current source. As a result, the signal AO2 outputted from the DAC circuit 122 can be calibrated equivalently.

Figure 2:
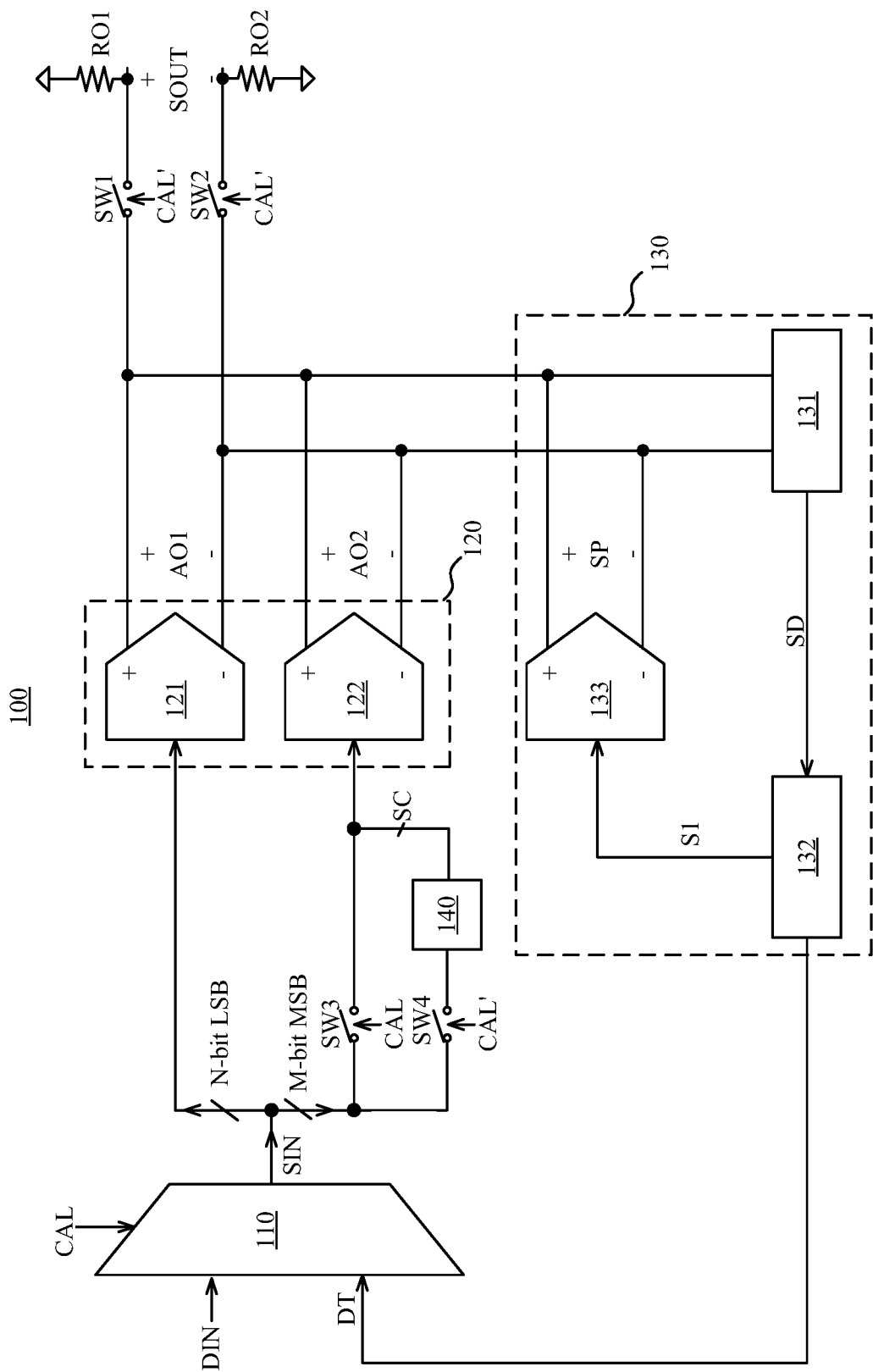
FIG. 2 is a schematic diagram of another arrangement of the DAC device according to some embodiments of the present disclosure.

Alternatively, reference is now made to FIG. 2, and FIG. 2 is a schematic diagram of another arrangement of the DAC device 100 according to some embodiments of the present disclosure. Compared with FIG. 1, in this example, the DAC circuit 133 is coupled to outputs of the DAC circuit 122. The DAC circuit 133 may be implemented with a current-steering DAC, and is configured to turn on the corresponding unity current source(s) thereof according to the calibration signal S1, in order to generate a corresponding current signal (i.e., the compensation signal SP) to the outputs of the DAC circuit 122. As a result, the compensation signal SP is directly summed up with the signal AO2, in order to calibrate an offset of the DAC circuit 122 equivalently. In some embodiments, a resolution of the DAC circuit 133 is higher than a resolution of DAC circuit 122.

Following paragraphs are given for illustrating operations of the calibration circuitry 130, but the present disclosure is not limited by following examples.

As described above, in some embodiments, each of the DAC circuits 121 and 122 is implemented with a current-steering DAC. In these embodiments, a corresponding ratio is present between multiple unity current sources of the DAC circuit 121 for processing the LSB (hereinafter referred to as "ideal current sources") and multiple unity current sources of the DAC circuit 122 for processing the MSB (hereinafter referred to as "current sources to be calibrated"). For example, if the LSB are encoded with binary code, and the MSB are encoded with thermometer code, currents of the ideal current sources (hereinafter referred to as "current ILSB") are different by 2 in sequence, a number of the current sources to be calibrated is $2^M-1$, M is a number of bits in the MSB, and a summation of the currents ILSB is expected to be equal to a current of a single current source to be calibrated (hereinafter referred to as "IMSB"). In other words, $\Sigma$ILSB=IMSB (hereinafter referred to as "equation 1").

Therefore, when operating in the calibration mode, the digital controller circuit 132 may output the testing signal DT having specific bit values. In an initial testing, all of low weighted bits (i.e., LSB) of the testing signal DT are 1, and a corresponding one of high weighted bits (i.e., MSB) of the testing signal DT is 1. Under this condition, all of ideal current sources are turned on to output all currents ILSB as the signal AO1, and a corresponding one of the current sources to be calibrated is turned on to output a single current IMSB as the signal AO2. With this arrangement, the detector circuit 131 is able to compare the signal AO1 with the signal AO2, in order to determine whether the equation 1 is satisfied. If the equation 1 is not satisfied, the detector circuit 131 is able to output a corresponding detection signal SD.

Moreover, the digital controller circuit 132 may perform the calibration algorithm (e.g., binary search or successive approximation) in response to the detection signal SD, in order to generate a corresponding calibration signal S1, in order to control the DAC circuit 133 to output a corresponding compensation signal SP. For example, the DAC circuit 133 generates the compensation signal SP to adjust bias voltage(s) of the current sources to be calibrated, as shown in FIG. 1. Alternatively, the DAC circuit 133 turns on corresponding unity current source(s) thereof according to the calibration signal S1 to output the corresponding current (s) as compensation signal SP, in order to compensate the signal AO2 directly, as shown in FIG. 2. In other words, in embodiments of FIG. 2, the equation 1 may be amended as ILSB=IMSB+SP. Accordingly, by performing one or more operations sequentially, the digital controller circuit 132 is able to determine an offset that is required to be calibrated for the single current source to be calibrated, and to record the corresponding calibration signal S1 to a memory (not shown) thereof.

After a corresponding compensation signal SP for a current source to be calibrated is recorded, the digital controller circuit 132 is able to update the corresponding one bit of the MSB in the testing signal DT to 0, and to update a next one bit of the MSB in the testing signal DT to 1, and then performs the above operations again. With this analogy, the digital controller circuit 132 can store the calibration signals S1, to which all current sources to be calibrated correspond, as a look-up table or the like. As a result, when one current source to be calibrated in the DAC circuit 122 is turned on, the digital controller circuit 132 is able to output a corresponding calibration signal S1, in order to control the DAC circuit 133 to generate the corresponding compensation signal SP to calibrate the DAC circuit 122. By this arrangement, static errors of DAC circuit 122 can be reduced.

It is noted that, for ease of understanding, the signals AO1 and AO2 and the compensation signal SP in FIGS. 1-2 are illustrated in a simplified way. In practical applications, the signal AO1 may be a summation of current (or voltage) signals (e.g., current ILSB) outputted from the DAC circuit 121, the signal AO2 may be a summation of current (or voltage) signals (e.g., current IMSB) outputted from the DAC circuit 122, and the compensation signal SP may be a summation of current (or voltage) signals outputted from the DAC circuit 133. With different types of signals, the detector circuit 131 may employ different circuit configurations to determine whether the equation 1 is satisfied. For example, if the above signals are current signals, the detector circuit 131 may be implemented with a current comparator and a switching circuit. The switching circuit is for swapping transmitting paths of current signals corresponding to the signals AO1 and AO2, such that the current comparator is able to acquire sufficient information to determine whether the equation 1 is satisfied. Alternatively, when the above signals are voltage signals, the detector circuit 131 may be implemented with an analog-to-digital converter circuit.

With the calibration circuitry 130, offsets of unity cells (e.g., current sources to be calibrated) in the DAC circuit 122 caused by variations (e.g., process variation) can be calibrated, in order to improve the resolution and linearity of the DAC circuit 122. The above operations are given with examples of using current steering DAC and binary search algorithm, but the present disclosure is not limited thereto. Various types of DACs (e.g., resistors type and capacitors type) and those of calibration algorithms are within the contemplated scope of the present disclosure.

With continued reference to FIG. 1, the randomization circuitry 140 is coupled between the multiplexer circuitry 110 and the DAC circuit 122. The randomization circuitry 140 is configured to perform a randomization algorithm according to the MSB of the input signal SIN, in order to generate control signals SC. The DAC circuit 122 further generates the signal AO2 according to the control signals SC.

In some embodiments, the randomization algorithm includes data weighted averaging (DWA) or dynamic element matching (DEM). The algorithms given above are able to reduce mismatches of the DAC circuit 122 (e.g., mismatches, at low frequency band, between the unity current sources and timing mismatches), in order to improve static errors and dynamic errors of the DAC circuit 122.

In some approaches, a single DAC circuit is employed to directly convert the input signal SIN. In these approaches, the linearity, at low frequency band, of the DAC circuit may be reduced due to static errors caused by mismatches between unity current sources, and the linearity, at medium/high frequency band, of the DAC circuit is reduced due to dynamic error caused by timing mismatches and/or limited output impedance. In some other approaches, a single calibration circuitry is employed to improve the linearity, at low frequency band, of the DAC circuit. However, in these approaches, the linearity, at medium/high frequency band, of the DAC circuit is still unable to be improved. In some yet approaches, a randomization circuit is employed to improve the linearity, at medium/high frequency band, of the DAC circuit. However, in these approaches, the randomization circuit is configured to process all bits (e.g., M+N bits) outputted by the DAC circuit. In these approaches, more circuits are required to process each bit, and thus the circuit area becomes larger. Furthermore, more circuits indicate that a critical path of the randomization circuit is longer. As a result, the latency is longer, and the DAC circuit is thus difficult to meet a high speed requirement.

Compared with these approaches, some embodiments of the present disclosure employs both of the calibration circuitry 130 and the randomization circuitry 140 to improve the static errors and the dynamic errors of the DAC circuit 122, in which randomization circuitry 140 performs the randomization only according to partial bits (i.e., M-bit MSB) of the input signal SIN. As a result, the linearity, at the low and high frequency bands, of the DAC circuit are both improved while the number of circuits, the circuit area, and the latency of the randomization circuitry 140 are all reduced.

In some embodiments, the DAC device 100 further includes switches SW1-SW4. The switches SW1-SW2 are coupled to output terminals and resistors RO1-RO2 of the DAC circuitry 120, respectively. The switch SW3 is coupled between input terminals and the multiplexer circuitry 110. The switch SW4 is coupled between the randomization circuitry 140 and the multiplexer circuitry 110.

When operating in the calibration mode, the switches SW1, SW2, and SW4 are not conducted (i.e., opened) in response to the mode control signal CAL', and the switch SW3 is conducted (i.e., closed) in response to the mode control signal CAL, in which the mode control signal CAL' is an inverse of the mode control signal CAL. Accordingly, in the calibration mode, the MSB of the input signal SIN are transmitted to DAC circuit 122 via the switch SW3, and the signals AO1 and AO2 can be transmitted to the detector circuit 131 correctly. Alternatively, when operating in the normal mode, the switch SW3 is not conducted in response to the mode control signal CAL, and the switches SW1, SW2, and SW4 are conducted in response to the mode control signal CAL'. Accordingly, in the normal mode, the MSB of the input signal SIN are transmitted to the randomization circuitry 140 via the switch SW4, and the signals AO1-AO2 can be transmitted to the resistors RO1 and RO2.

The arrangements of the switches SW1-SW4 are given for illustrative purposes, and the present disclosure is not limited thereto. In some embodiments, the DAC device 100 may operate in the calibration mode first, and then operate in the normal mode after the DAC circuit is calibrated. In other words, the operations of the randomization circuitry 140 are performed after the DAC circuit 122 is calibrated. Alternatively, in some embodiments where the switches SW3-SW4 are not employed, the calibration circuitry 130 and the randomization circuitry 140 may operate simultaneously.

Figure 3:
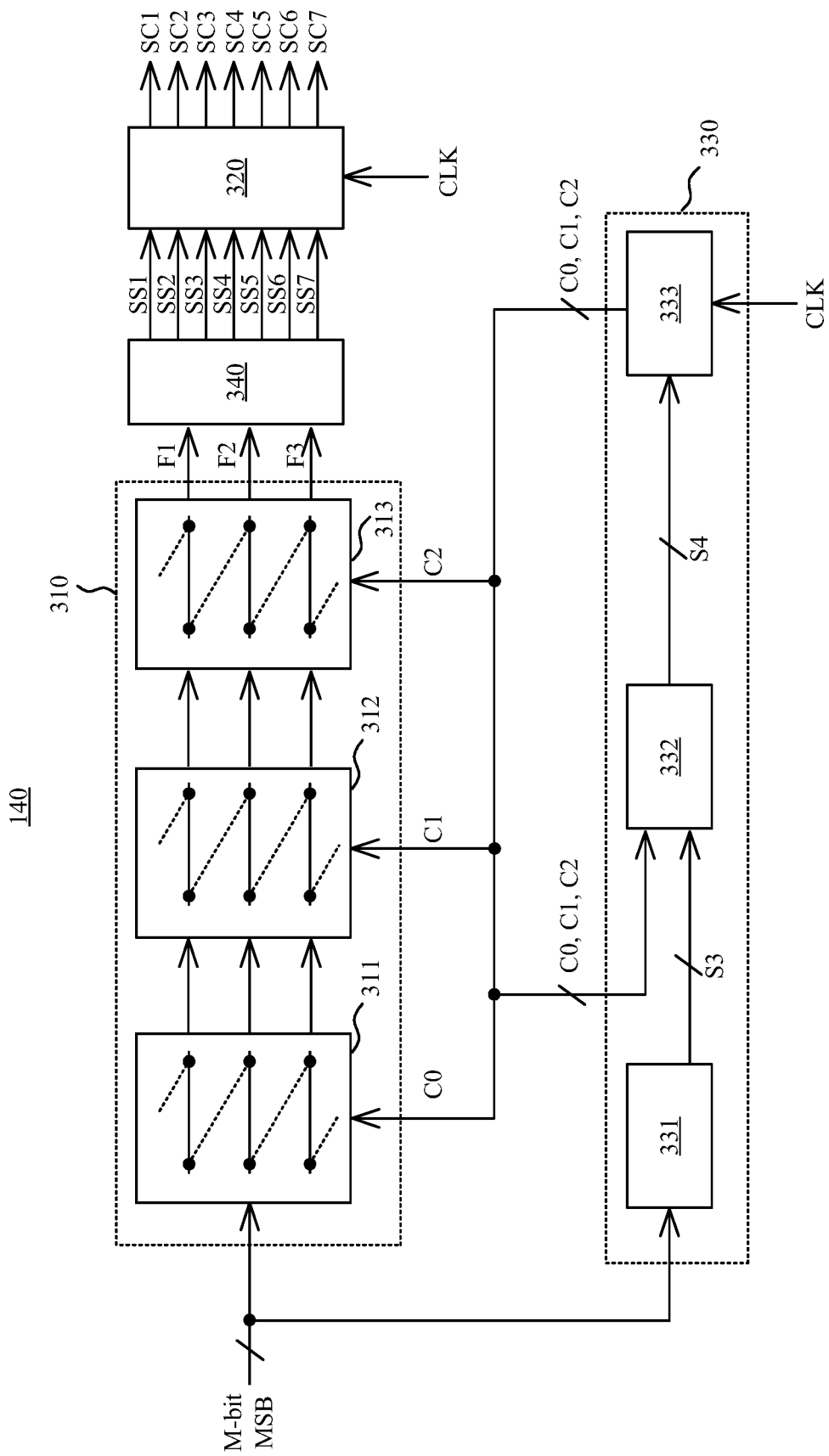
FIG. 3 is a circuit diagram of the randomization circuitry in FIGS. 1-2, according to some embodiments of the present disclosure.

Reference is made to FIG. 3. FIG. 3 is a circuit diagram of the randomization circuitry 140 in FIGS. 1-2, according to some embodiments of the present disclosure. In FIG. 3, the randomization circuitry 140 performs the DWA algorithm, in which M is set to be 3, but the present disclosure is not limited thereto. The randomization circuitry 140 includes a barrel shifter 310, a register 320, a control circuit 330, and a mapping circuit 340.

The barrel shifter 310 includes shifters 311-313. In some embodiments, the shifters 311-133 may be implemented with multiplexer circuits, in which these multiplexer circuits are switched according to corresponding control signals C0, C1, and C2. The shifter 311 is coupled to the multiplexer circuitry 110 in FIG. 1, in order to receive the M-bit (in this example, M=3) MSB. The shifters 311-313 sequentially shift the M-bit MSB according to the control signals C0, C1, and C2, respectively. Equivalently, the M-bit MSB is alternately shifted by the shifters 311-313. The shifters 311-313 output the shifted 3-bit MSB (labeled as F1, F2, and F3) to the mapping circuit 340. The mapping circuit 340 outputs shifted signals SS1-SS7 to the register 320 according to the bits F1, F2, and F3 and the control signals C0-C2. The register 320 outputs the shifted signals SS1-SS7 as control signals SC1-SC7 (corresponding to the control signals SC in FIG. 1) according to a clock signal CLK.

In some embodiments, the mapping circuit 340 may be implemented with an encoder, but the present disclosure is not limited thereto. The mapping circuit 340 is coupled to the barrel shifter 310, in order to receive the bits F1-F3. In some embodiments, the mapping circuit 340 may determine a corresponding relationship between the bits F1-F3 and the 3-bit MSB according to the control signals C0-C2, and outputs the control signals SS1-SS7 in the corresponding order. For example, if the bits F2, F3, and F1 sequentially correspond to the 3-bit MSB (i.e., the 3-bit MSB may be expressed as F2F3F1), the shifted signal SS1 corresponds to the bit F1, the shifted signals SS2-SS5 correspond to the bit F2, and the shifted signals SS6-8S7 correspond to the bit F3. If the bits F3, F1, and F2 sequentially correspond to the 3-bit MSB (i.e., the 3-bit MSB may be expressed as F3F1F2), the shifted signals SS1-SS2 correspond to the bit F1 the shifted signal SS3 corresponds to the bit F2, and the shifted signals SS4-SS7 correspond to the bit F3.

The control circuit 330 includes an encoder 331, an adder 332, and a register 333. The encoder 331 is configured to encode the M-bit MSB, in order to generate the signal S3. The adder 332 sums up the control signals C0-C2 and the signal S3, in order to generate a signal S4. The register 333 outputs the control signals C0-C2 according to the clock signal CLK and the signal S4.

Figure 4:
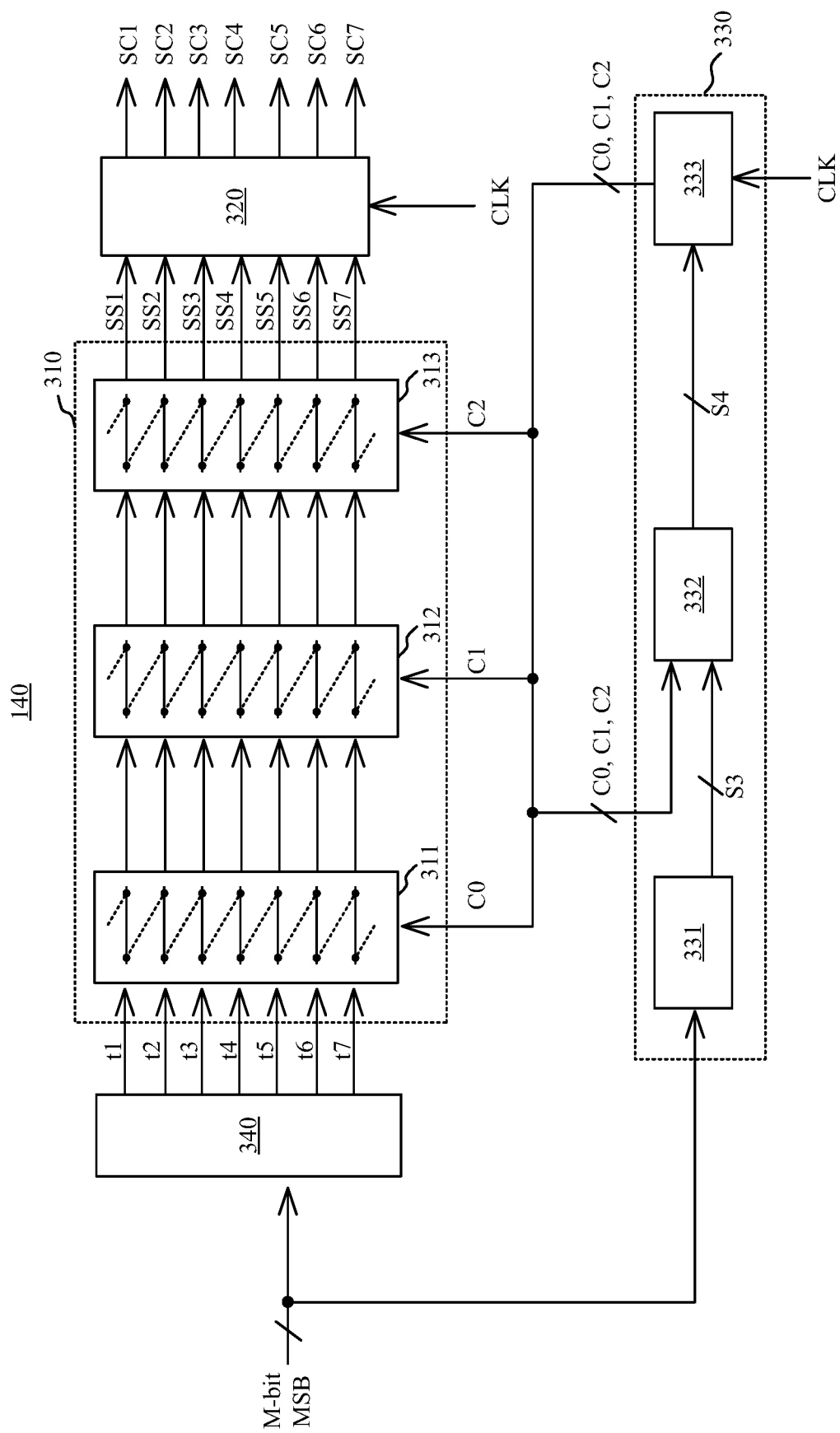
FIG. 4 is a circuit diagram of the randomization circuitry in FIG. 1, according to some embodiments of the present disclosure.

Reference is now made to FIG. 4. FIG. 4 is a circuit diagram of the randomization circuitry 140 in FIG. 1, according to some embodiments of the present disclosure.

Compared with FIG. 3, in a randomization circuitry 140 of FIG. 4, the mapping circuit 340 is arranged prior to the barrel shifter 310, in order to be coupled to the multiplexer circuitry 110 in FIG. 1 to receive the M-bit MSB. In other words, in this example, the M-bit MSB is processed by the mapping circuit 340 to generate digital codes (e.g., thermometer code) t1-t7.

The barrel shifter 310 is coupled to the mapping circuit 340, in order to receive the digital codes t147. The shifters 311-313 shift the digital codes t1-t7 according to the control signals C0-C2, respectively, in order to generate the shifted signals SS1-SS7 and to transmit the same to the register 320. Accordingly, the register 320 outputs the shifted signals SS1-SS7 as the control signal SC1-SC7 according to the clock signal CLK.

As shown in FIG. 4, the control signals C0-C2 are configured to control the shifters 311-313. If the control signal C0 is 1, the digital codes are shifted by 4 bit-positions. If the control signal C1 is 1, the digital codes are shifted by 2 bit-positions. If the control signal C2 is 1, the digital codes are shifted by 1 bit-position. In other words, if the control signals C0-C2 are expressed as C0C1C2, and if C0C1C2 is 000, the digital codes are not shifted. If C0C1C2 is 001, the digital codes are shifted by 1 bit-position. If C0C1C2 is 010, the digital codes are shifted by 2 bit-positions.

In some embodiments, the barrel shifter 310 in FIG. 4 may be implemented with a single shifter, and this single shifter may receive the control signals C0-C2, and may shift the digital codes according to the received control signals.

Figure 5:
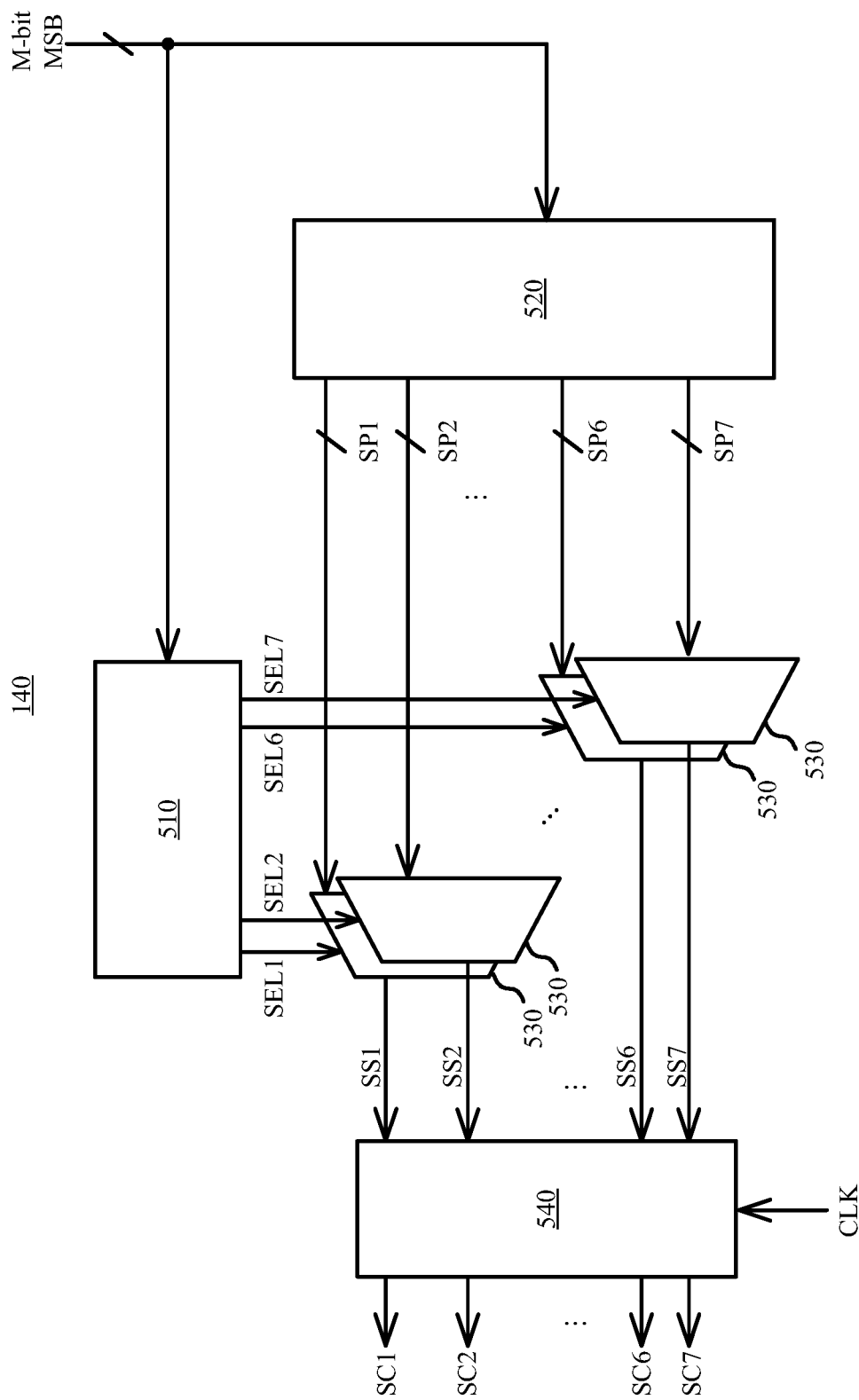
FIG. 5 is a circuit diagram of the randomization circuitry in FIG. 1 according to some embodiments of the present disclosure.

Reference is made to FIG. 5. FIG. 5 is a circuit diagram of the randomization circuitry 140 in FIG. 1 according to some embodiments of the present disclosure.

For ease of understanding, the circuit arrangement in FIG. 5 is illustrated with an example of M=3. In this example, the randomization circuitry 140 performs the DWA algorithm. The randomization circuitry 140 includes a pointer 510, an encoder 520, multiplexer circuits 530, and a register 540. The pointer 510 is configured to perform a calculation according to the M-bit MSB, in order to generate selection signals SEL1-SEL7. The pointer 510 may be implemented with a digital circuit for processing M-bit signals. For example, the pointer 510 may be implemented with an encoder, one or more accumulators, and a register. In this example, the number of the unity components in the DAC circuit 122 is $2^M-1$. The pointer 510 performs the calculation according to the DWA algorithm, in order to point one component of the unity components as an initial point of the next operation.

The encoder 520 is coupled to the multiplexer circuitry 110 in FIG. 1, in order to receive the M-bit MSB. In some embodiments, the encoder 520 performs an encoding conversion according to the M-bit MSB, in order to generate $2^M-1$ input patterns SP. If M=3, the encoder 520 outputs seven different input patterns SP1-SP7 to the multiplexer circuits 530. For example, the 3-bit MSB is 101, the corresponding thermometer code is 0011111, and the encoder 520 may shift this thermometer code to generate the input patterns SP1-SP7. Under this condition, the selection signals SEL1-SEL7 may be set to have the same signal values, in order to achieve the randomization.

Alternatively, in some other embodiments, the selection signals SEL1-SEL7 may have different signal values, and the input patterns SP may have the same signal value. With this arrangement, the randomization is achieved as well.

In various embodiments, the encoder 520 may be implemented with other digital code converter(s) or register circuits. The input patterns are given for illustrative purposes, and various input patterns able to be applied to the present disclosure are within the contemplated scope of the present disclosure.

In this example, the number of the multiplexer circuits 530 is $2^M-1$. Each of the multiplexer circuits 530 is coupled to the pointer 510 to receive a corresponding signal SEL, and is coupled to the encoder 520 to receive a corresponding one of the input patterns SP1-SP7. Each of the multiplexer circuits 530 is configured to output a bit of the corresponding one of the input patterns SP1-SP7 as a corresponding one of the shifted signal SS1-SS7 according to the selection signals SEL1-SEL7.

The register 540 is coupled to the multiplexer circuits 530 to receive the shifted signals SS1-SS7, and outputs the shifted signals SS1-SS7 as the control signals SC1-SC7 (which correspond to control signals SC in FIG. 1) respectively according to the clock signal CLK. As mentioned above, each of the control signals SC1-SC7 is configured to control a corresponding unity component of the DAC circuit 122 in FIG. 1.

Equivalently, the randomization circuitries 140 in FIGS. 3-5 may operate as a data shuffler or a scrambler that is configured to scatter and to map the relationship between the M-bit MSB and the unity components of the DAC circuit 122 in FIG. 1.

The arrangements of the randomization circuitry 140 are given for illustrative purposes. Various circuits able to perform the randomization algorithm are within the contemplated scope of the present disclosure.

As described above, the DAC device provided in embodiments of the present disclosure employs both of calibration mechanism and randomization mechanism to improve the linearity, at low and high frequency bands, of the DAC device, in which the randomization mechanism may be arranged to randomize partial bits to reduce circuit area for meeting the high speed requirement.

Various functional components or blocks have been described herein. As will be appreciated by persons skilled in the art, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuity in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A digital-to-analog converter (DAC) device, comprising:
    a DAC circuitry, comprising:
    a first DAC circuit configured to generate a first signal according to a plurality of least significant bits of an input signal; and
    a second DAC circuit configured to output a second signal;
    a calibration circuitry configured to compare the first signal with the second signal, in order to calibrate the second DAC circuit; and
    a randomization circuitry configured to randomize a plurality of most significant bits of the input signal, in order to generate a plurality of first control signals, wherein the second DAC circuit is further configured to selectively receive the plurality of most significant bits or the plurality of first control signals based on an operation mode of the DAC device to generate the second signal according to the plurality of most significant bits or the plurality of first control signals.

2. The DAC device of claim 1, wherein each of the first DAC circuit and the second DAC circuit is implemented with a current-steering DAC circuit.

3. The DAC device of claim 1, wherein the calibration circuitry comprises:
    a detector circuit configured to compare the first signal with the second signal, in order to generate a detection signal;
    a digital controller circuit configured to perform a calibration operation according to the detection signal, in order to generate a calibration signal; and
    a third DAC circuit configured to output a compensation signal according to the calibration signal, in order to calibrate the second DAC circuit.

4. The DAC device of claim 3, wherein the compensation signal is configured to be summed up with the second signal directly.

5. The DAC device of claim 3, wherein the compensation signal is inputted to the second DAC circuit directly.

6. The DAC device of claim 3, further comprising:
    a multiplexer circuitry configured to selectively output one of a data signal or a testing signal as the input signal according to a first mode control signal,
    wherein the digital controller circuit is further configured to provide the testing signal to the multiplexer circuitry.

7. The DAC device of claim 6, further comprising:
    a first switch configured to be conducted according to the first mode control signal, in order to transmit the plurality of most significant bits of the input signal from the multiplexer circuitry to the second DAC circuit; and
    a second switch configured to be conducted according to a second mode control signal, in order to transmit the plurality of most significant bits of the input signal from the multiplexer circuitry to the randomization circuitry, wherein the second mode control signal is an inverse of the first mode control signal.

8. The DAC device of claim 6, further comprising:
    a plurality of switches coupled to a plurality of output terminals of the DAC circuitry, the plurality of switches configured to be conducted according to a second mode control signal to transmit the first signal and the second signal, wherein the second mode control signal is an inverse of the first mode control signal; and
    a plurality of resistors coupled to the plurality of switches, the plurality of resistors configured to generate an analog output according to the first signal and the second signal when the plurality of switches are conducted.

9. The DAC device of claim 1, wherein the randomization circuitry comprises:
    a barrel shifter configured to shift the plurality of most significant bits according to a plurality of second control signals;
    a mapping circuit configured to output a plurality of shifted signals according to the plurality of shifted partial most significant bits;
    a first register configured to output the plurality of shifted signals as the plurality of first control signals according to a clock signal; and
    a control circuit configured to generate the plurality of second control signals according to the plurality of most significant bits.

10. The DAC device of claim 9, wherein the control circuit comprises:
    an encoder configured to encode the plurality of most significant bits, in order to generate a third signal;
    an adder configured to sum up the third signal and the plurality of second control signals, in order to generate a fourth signal; and
    a second register configured to output the plurality of second control signals according to the fourth signal and the clock signal.

11. The DAC device of claim 1, wherein the randomization circuitry comprises:
    a mapping circuit configured to output a plurality of digital codes according to the plurality of most significant bits;
    a barrel shifter configured to shift the plurality of digital codes according to a plurality of second control signals;
    a first register configured to output the plurality of shifted digital codes as the plurality of first control signals according to a clock signal; and a control circuit configured to generate the plurality of second control signals according to the plurality of most significant bits.

12. The DAC device of claim 1, wherein the randomization circuitry comprises:
a pointer configured to perform a calculation according to the plurality of most significant bits, in order to generate a plurality of selection signals;
an encoder configured to generate a plurality of input patterns according to the plurality of most significant bits;
a plurality of multiplexer circuits configured to generate a plurality of shifted signals according to the plurality of selection signals and the plurality of input patterns; and
a register configured to output the plurality of shifted signals as the plurality of first control signals respectively according to a clock signal.

13. The DAC device of claim 1, wherein the second DAC circuit is configured to convert the plurality of first control signals to the second signal in a first mode, and is configured to convert the plurality of most significant bits to the second signal in a second mode.

14. The DAC device of claim 13, wherein the calibration circuitry is further configured to perform a calibration operation in the first mode, in order to calibrate the second DAC circuit.

15. The DAC device of claim 1, wherein the randomization circuitry is configured to randomize the plurality of most significant bits after the second DAC circuit is calibrated, in order to generate the plurality of first control signals.

16. A digital-to-analog converter (DAC) device, comprising:
a DAC circuitry, comprising:
a first DAC circuit configured to generate a first signal according to a plurality of least significant bits of an input signal; and
a second DAC circuit configured to output a second signal;
a calibration circuitry configured to compare the first signal with the second signal, in order to calibrate the second DAC circuit; and
a randomization circuitry configured to randomize a plurality of most significant bits of the input signal, in order to generate a plurality of first control signals, wherein the second DAC circuit is further configured to generate the second signal according to the plurality of most significant bits or the plurality of first control signals, wherein the randomization circuitry comprises:
a mapping circuit configured to output a plurality of digital codes according to the plurality of most significant bits;
a barrel shifter configured to shift the plurality of digital codes according to a plurality of second control signals;
a first register configured to output the plurality of shifted digital codes as the plurality of first control signals according to a clock signal; and
a control circuit configured to generate the plurality of second control signals according to the plurality of most significant bits.

17. The DAC device of claim 16, wherein the second DAC circuit is configured to convert the plurality of first control signals to the second signal in a first mode, and is configured to convert the plurality of most significant bits to the second signal in a second mode.

18. The DAC device of claim 16, wherein the randomization circuitry is configured to randomize the plurality of most significant bits after the second DAC circuit is calibrated, in order to generate the plurality of first control signals.

19. A digital-to-analog converter (DAC) device, comprising:
a DAC circuitry, comprising:
a first DAC circuit configured to generate a first signal according to a plurality of least significant bits of an input signal; and
a second DAC circuit configured to output a second signal;
a calibration circuitry configured to compare the first signal with the second signal, in order to calibrate the second DAC circuit; and
a randomization circuitry configured to randomize a plurality of most significant bits of the input signal, in order to generate a plurality of first control signals, wherein the second DAC circuit is further configured to generate the second signal according to the plurality of most significant bits or the plurality of first control signals, wherein the randomization circuitry comprises:
a pointer configured to perform a calculation according to the plurality of most significant bits, in order to generate a plurality of selection signals;
an encoder configured to generate a plurality of input patterns according to the plurality of most significant bits;
a plurality of multiplexer circuits configured to generate a plurality of shifted signals according to the plurality of selection signals and the plurality of input patterns; and
a register configured to output the plurality of shifted signals as the plurality of first control signals respectively according to a clock signal.

20. The DAC device of claim 19, wherein the second DAC circuit is configured to convert the plurality of first control signals to the second signal in a first mode, and is configured to convert the plurality of most significant bits to the second signal in a second mode.

* * * * *